(12) United States Patent
Onishi et al.

(10) Patent No.: US 9,281,989 B2
(45) Date of Patent: Mar. 8, 2016

(54) COMPENSATION APPARATUS, SIGNAL GENERATOR AND WIRELESS COMMUNICATION EQUIPMENT

(71) Applicant: SUMITOMO ELECTRIC INDUSTRIES, LTD., Osaka-shi, Osaka (JP)

(72) Inventors: Masahiko Onishi, Osaka (JP); Isao Katsura, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/689,398

(22) Filed: Apr. 17, 2015

(65) Prior Publication Data
US 2015/0222469 A1 Aug. 6, 2015

Related U.S. Application Data

(62) Division of application No. 14/131,238, filed as application No. PCT/JP2012/068706 on Jul. 24, 2012.

(30) Foreign Application Priority Data

Jul. 26, 2011 (JP) ................................. 2011-163344
Jul. 26, 2011 (JP) ................................. 2011-163374

(51) Int. Cl.
*H03D 3/24* (2006.01)
*H04L 27/34* (2006.01)
(Continued)

(52) U.S. Cl.
CPC ............ *H04L 27/3455* (2013.01); *H03L 7/093* (2013.01); *H03L 7/099* (2013.01); *H03L 7/104* (2013.01); *H04B 1/10* (2013.01); *H04B 1/28* (2013.01); *H04L 7/0331* (2013.01); *H04L 27/38* (2013.01); *H04L 27/3863* (2013.01)

(58) Field of Classification Search
CPC ... H04L 27/3455; H04L 7/0331; H03L 7/099; H03L 7/093
USPC ........................................................ 375/376
See application file for complete search history.

(56) References Cited

U.S. PATENT DOCUMENTS

| 4,447,792 | A | | 5/1984 | Wynn | |
|---|---|---|---|---|---|
| 5,304,956 | A | * | 4/1994 | Egan | ............................... 331/10 |

(Continued)

FOREIGN PATENT DOCUMENTS

| JP | H06-224691 A | 8/1994 |
|---|---|---|
| JP | H08-307465 A | 11/1996 |

(Continued)

*Primary Examiner* — Juan A Torres
(74) *Attorney, Agent, or Firm* — Drinker Biddle & Reath LLP

(57) ABSTRACT

A compensation apparatus compensates a quadrature-demodulated signal output from a quadrature demodulator 5 that performs quadrature demodulation by using a signal of a carrier frequency fc, by removing an image component caused by the quadrature demodulator 5 from the quadrature-demodulated signal. The compensation apparatus includes a signal generator 10 that generates a reference signal having a predetermined bandwidth in a reception band, and provides the reference signal to an input side of the quadrature demodulator 5. The reference signal includes a frequency band that is biased to either a higher-frequency side or a lower-frequency side with respect to the carrier frequency.

9 Claims, 12 Drawing Sheets

(51) Int. Cl.
*H04B 1/28* (2006.01)
*H04L 27/38* (2006.01)
*H04B 1/10* (2006.01)
*H03L 7/10* (2006.01)
*H03L 7/093* (2006.01)
*H03L 7/099* (2006.01)
*H04L 7/033* (2006.01)

(56) References Cited

U.S. PATENT DOCUMENTS

| | | | |
|---|---|---|---|
| 5,834,979 A * | 11/1998 | Yatsuka | 331/1 R |
| 6,009,317 A | 12/1999 | Wynn | |
| 6,044,112 A | 3/2000 | Koslov | |
| 6,127,865 A * | 10/2000 | Jefferson | 327/149 |
| 6,140,881 A * | 10/2000 | Kim | 331/20 |
| 6,330,290 B1 | 12/2001 | Glas | |
| 6,664,831 B2 * | 12/2003 | Gauthier et al. | 327/159 |
| 7,020,220 B2 | 3/2006 | Hansen | |
| 7,130,359 B2 | 10/2006 | Rahman | |
| 7,151,917 B2 | 12/2006 | Paulus | |
| 7,239,188 B1 * | 7/2007 | Xu et al. | 327/156 |
| 7,254,379 B2 | 8/2007 | Xu et al. | |
| 7,783,273 B2 | 8/2010 | Maeda et al. | |
| 8,553,473 B2 * | 10/2013 | Kim et al. | 365/189.07 |
| 2003/0072393 A1 | 4/2003 | Gu | |
| 2004/0087279 A1 | 5/2004 | Muschallik et al. | |
| 2005/0069056 A1 | 3/2005 | Willingham | |
| 2006/0007999 A1 | 1/2006 | Gomez et al. | |
| 2006/0203901 A1 | 9/2006 | Tan et al. | |
| 2006/0280277 A1 * | 12/2006 | Tashiro et al. | 375/376 |
| 2007/0080835 A1 | 4/2007 | Maeda et al. | |
| 2007/0202825 A1 | 8/2007 | Park et al. | |
| 2008/0159442 A1 | 7/2008 | Tanabe et al. | |
| 2008/0212662 A1 | 9/2008 | Lee et al. | |
| 2010/0311379 A1 * | 12/2010 | Rofougaran et al. | 455/307 |
| 2011/0228616 A1 * | 9/2011 | Kim et al. | 365/189.07 |

FOREIGN PATENT DOCUMENTS

| | | | |
|---|---|---|---|
| JP | H10-163756 A | 6/1998 | |
| JP | 2007-104522 A | 4/2007 | |
| JP | 2010-130630 A | 6/2010 | |
| WO | WO 2009026513 A2 * | 2/2009 | H03L 7/187 |

* cited by examiner

COMPENSATION APPARATUS, SIGNAL GENERATOR AND WIRELESS COMMUNICATION EQUIPMENT

This is a divisional application of copending application Ser. No. 14/131,238, having a §371 date of Jan. 7, 2014, which is a national stage filing based on PCT International Application No. PCT/JP2012/068706, filed on Jul. 24, 2012. The copending application Ser. No. 14/131,238 is incorporated by reference herein in its entirety.

TECHNICAL FIELD

The present invention relates to a compensation apparatus, a signal generator, and wireless communication equipment.

BACKGROUND ART

When a quadrature-modulated signal is received, quadrature demodulation for the received signal needs to be performed. The quadrature demodulation is performed by using a signal of a carrier frequency. Such quadrature demodulation is disclosed in Patent Literature 1.

CITATION LIST

Patent Literature

Patent Literature 1: Japanese Laid-Open Patent Publication No. 2010-130630

SUMMARY OF THE INVENTION

Problems to be Solved by the Invention

When quadrature demodulation is performed by analog signal processing as described in Patent Literature 1, a received signal might be subjected to distortion due to a quadrature demodulator.

Such distortion is caused by, for example, deviation of quadrature in the quadrature demodulator, I/Q gain imbalance (I/Q imbalance in the analog quadrature demodulator), or the like. The distortion caused by deviation of quadrature or IQ gain imbalance (I/Q imbalance) is called an image component.

In order to compensate a quadrature-demodulated signal by rejecting the image component, compensation parameters for rejecting the image component are calculated, and the compensation parameters are applied to the quadrature-demodulated signal.

In order to reject the image component caused by the quadrature demodulator, the characteristics of the signal before being input to the quadrature demodulator need to be known. However, since the signal before being input to the quadrature demodulator is a signal that has been received after passing through a propagation path, it is difficult to know the characteristics of the signal.

Therefore, an object of the present invention is to facilitate rejection of an image component caused by a quadrature-demodulated signal.

Solution to the Problems (1) A compensation apparatus according to an aspect of the present invention is a compensation apparatus that compensates a quadrature-demodulated signal output from a quadrature demodulator that performs quadrature demodulation by using a signal of a carrier frequency, by removing an image component caused by the quadrature demodulator from the quadrature-demodulated signal. The compensation apparatus includes: a signal generator that generates a reference signal having a predetermined bandwidth in a reception band, and gives the reference signal to an input side of the quadrature demodulator; a calculation section that calculates compensation parameters for rejecting the image component, based on a signal obtained by quadrature-demodulating the reference signal with the quadrature demodulator; and an image component rejection section that rejects the image component from the quadrature-demodulated signal based on the compensation parameters. The reference signal includes a frequency band that is biased to either a higher-frequency side or a lower-frequency side with respect to the carrier frequency. The calculation section generates, as a reference signal replica, a signal on which the image component in the frequency domain is not superimposed, the signal being a part of the signal obtained by quadrature-demodulating the reference signal and output from the quadrature demodulator, and calculates the compensation parameters, based on a signal for calculation that includes the reference signal replica and an image component caused by the reference signal replica, and on the reference signal replica.

According to the compensation apparatus having the above configuration, the calculation section generates, as a reference signal replica, a signal on which the image component in the frequency domain is not superimposed because the frequency band of the reference signal is biased with respect to the carrier frequency, the signal being a part of the signal obtained by quadrature-demodulating the reference signal and output from the quadrature demodulator. In addition, the calculation section calculates the compensation parameters, based on a signal for calculation that includes the reference signal replica and an image component caused by the reference signal replica, and on the reference signal replica.

That is, since the reference signal is biased with respect to the carrier frequency, a portion on which no image component is superimposed is ensured in at least a part of a portion corresponding to the original reference signal. By using the portion on which no image component is superimposed, as a reference signal replica, it is possible to estimate the image component. Furthermore, it is possible to calculate compensation parameters for rejecting the image component.

(2) The reference signal preferably exists only in a frequency band on either the higher-frequency side or the lower-frequency side with respect to the carrier frequency. The calculation section preferably generates, as a reference signal replica, a signal having a frequency band corresponding to the entirety of the reference signal, the signal being a part of the signal obtained by quadrature-demodulating the reference signal and output from the quadrature demodulator. The signal for calculation is preferably the signal obtained by quadrature-demodulating the reference signal.

Since the image component appears symmetrically to the reference signal with respect to the carrier frequency, if the reference signal exists only in a frequency band on either the higher-frequency side or the lower-frequency side with respect to the carrier frequency, the image component appears in a region different from the region where the reference signal appears. Accordingly, the image component and the reference signal can be easily separated from each other.

(3) Preferably, the calculation section generates the reference signal replica by removing, from the signal obtained by quadrature-demodulating the reference signal, a signal in a frequency band on the side where the reference signal does not exist with respect to a frequency corresponding to the carrier frequency. Since the image component exists in the frequency band on the side where the reference signal does not exist with respect to the frequency corresponding to the carrier frequency, it is possible to easily generate a reference signal replica having no image component by removing the signal in the frequency band.

(4) The reference signal preferably extends across the carrier frequency and is biased to either the higher-frequency side or the lower-frequency side with respect to the carrier frequency. The calculation section preferably generates, as a reference signal replica, a signal obtained by removing a portion on which the image component is superimposed, from a signal having a frequency band corresponding to the reference signal, in the signal obtained by quadrature-demodulating the reference signal and output from the quadrature demodulator. The signal for calculation is preferably a signal obtained by removing the portion on which the image component is superimposed, from the signal obtained by quadrature-demodulating the reference signal. Even when the reference signal extends across the carrier frequency, if the reference signal is biased to either the higher-frequency side or the lower-frequency side with respect to the carrier frequency, a portion on which no image component is superimposed is ensured in at least a part of the portion corresponding to the original reference signal. By using the portion on which no image component is superimposed, as a reference signal replica, it is possible to estimate the image component.

(5) The signal generator is preferably a phase lock loop type signal generator in which an oscillation frequency of a voltage-controlled oscillator is determined by a control voltage based on an output signal of a phase comparator, and includes an external signal generation section that generates an external signal that varies with time. The control voltage is preferably obtained by superimposing the external signal on the output signal of the phase comparator. By superimposing the external signal that temporally varies on the output signal of the phase comparator, it is possible to generate a signal whose frequency temporally varies. The signal whose frequency temporally varies can be regarded as a signal having a frequency bandwidth if the time is ignored. That is, the above signal generator can easily generate a signal having a frequency bandwidth.

(6) The compensation apparatus preferably include a switch section that performs switching between a first mode where the control voltage in which the external signal is superimposed on the output signal of the phase comparator is given to the voltage-controlled oscillator, and a second mode where the control voltage in which the external signal is not superimposed on the output signal of the phase comparator is given to the voltage-controlled oscillator. In this case, a signal having a bandwidth can be caused by temporal variation in frequency in the first mode, and a signal having a constant frequency can be generated in the second mode.

(7) Wireless communication equipment according to another aspect of the present invention is wireless communication equipment including the compensation apparatus according to above (1).

(8) Wireless communication equipment according to still another aspect of the present invention is wireless communication equipment including the compensation apparatus according to above (5). The compensation apparatus further includes: a switch section that performs switching between a first mode where the control voltage in which the external signal is superimposed on the output signal of the phase comparator is given to the voltage-controlled oscillator, and a second mode where the control voltage in which the external signal is not superimposed on the output signal of the phase comparator is given to the voltage-controlled oscillator; and a measurement section that measures a gain of the receiver by giving, to the receiver, a signal of a single frequency that has been output from the signal generator in the second mode.

As described above, it is difficult to know the characteristics of a signal before being input to the quadrature demodulator. Therefore, it is considered that a reference signal having a predetermined bandwidth is generated and input to the quadrature demodulator.

However, in order to generate an accurate reference signal, the reference signal needs to be precisely managed in digital form, and moreover, a DA converter and a modulator are needed, which might cause increase in the cost and size of the apparatus.

So, another aspect of the present invention has an object to generate a signal having a predetermined bandwidth without performing complicated control in digital form.

(9) That is, a signal generator according to another aspect of the present invention is a phase lock loop type signal generator in which an oscillation frequency of a voltage-controlled oscillator is determined by a control voltage based on an output signal of a phase comparator, and includes an external signal generation section that generates an external signal that varies with time. The control voltage is obtained by superimposing the external signal on the output signal of the phase comparator.

A general phase lock loop type signal generator generates a signal of a single frequency. However, according to the present invention, since the temporally-varying external signal output from the external signal generation section is superimposed on the output signal of the phase comparator, a signal whose frequency temporally varies is output from the voltage-controlled oscillator. The signal whose frequency temporally varies can be regarded as a signal having a predetermined bandwidth if the time is ignored.

(10) The frequency of the external signal is preferably smaller than a phase comparison frequency in the phase comparator. In this case, it is easy to appropriately control the frequency that varies due to the external signal.

(11) Preferably, the signal generator further includes an adjustment section that adjusts an amplitude of the external signal. By adjusting the amplitude of the external signal, it is possible to adjust the bandwidth of the signal generated by the signal generator.

(12) Preferably, the signal generator further includes an adjustment section that adjusts a ratio between the phase comparison frequency in the phase comparator and the frequency of the external signal. By adjusting the ratio between the phase comparison frequency and the frequency of the external signal, it is possible to adjust the bandwidth of the signal generated by the signal generator.

(13) Preferably, the signal generator further includes: a charge pump circuit provided between the phase comparator and the voltage-controlled oscillator; and an adjustment section that adjusts a charge pump current flowing through the charge pump circuit. By adjusting the charge pump current, it is possible to adjust the bandwidth of the signal generated by the signal generator.

(14) Preferably, the signal generator further includes: a low-pass filter provided between the phase comparator and the voltage-controlled oscillator; and an adjustment section that adjusts a time constant of the low-pass filter. By adjusting the time constant of the low-pass filter, it is possible to adjust the bandwidth of the signal generated by the signal generator.

(15) Preferably, the signal generator further includes an adjustment section that adjusts a frequency range of the oscillation frequency of the voltage-controlled oscillator, the oscillation frequency varying with time, and the adjustment section adjusts the frequency range by that the external signal is superimposed on the output signal of the phase comparator. In this case, it is possible to adjust the frequency range (bandwidth) of the signal generated by the signal generator.

(16) Preferably, the external signal is a sine wave.

(17) Preferably, the signal generator further includes a switch section that performs switching between a first mode where the control voltage in which the external signal is superimposed on the output signal of the phase comparator is given to the voltage-controlled oscillator, and a second mode where a control voltage in which the external signal is not superimposed on the output signal of the phase comparator is given to the voltage-controlled oscillator. In this case, the signal generator can be switched between the first mode and the second mode.

(18) Wireless communication equipment according to another aspect of the present invention is wireless communication equipment using a signal generated by the signal generator described in any one of above (9) to (17).

The present invention may be implemented as a semiconductor integration circuit (LSI) having a part or all of the functions of the compensation apparatus, the signal generator, and the wireless communication equipment.

DESCRIPTION OF EMBODIMENTS

Hereinafter, preferred embodiments of the present invention will be described with reference to the drawings.

[1. Configuration of Communication Equipment]

Figure 1:
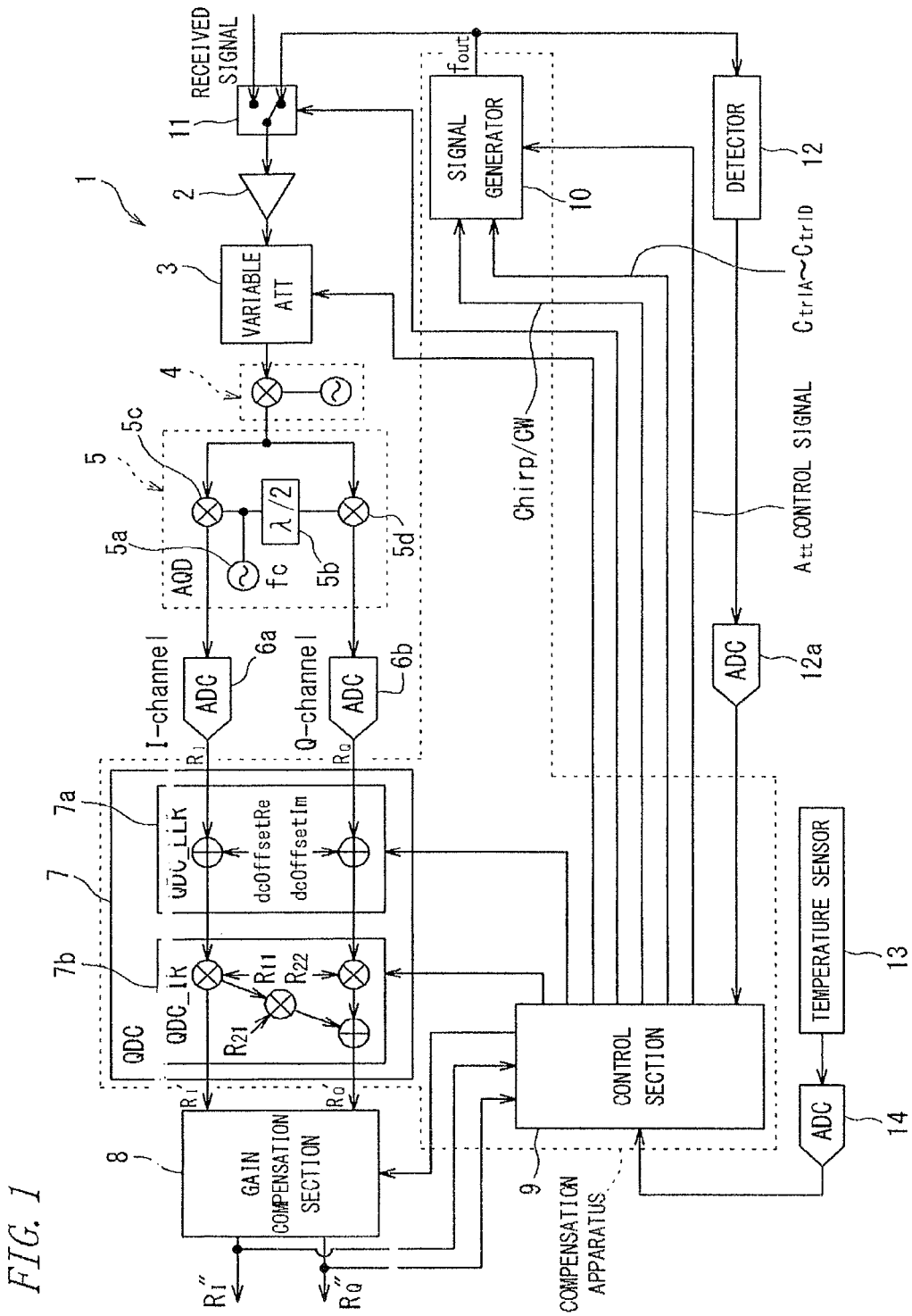
FIG. 1 is a block diagram showing wireless communication equipment (receiver).

FIG. 1 shows a configuration of a receiver in wireless communication equipment having transmitting and receiving functions. The wireless communication equipment is used as wireless base station equipment or wireless terminal equipment. The configuration shown in FIG. 1 may be used not only as a receiver but also as a monitor device that receives a transmission signal transmitted from itself, in order to monitor a transmission signal transmitted from a transmitter of its own wireless communication equipment (e.g., monitoring for DPD (Digital Pre-Distortion) of a transmission amplifier).

The receiver 1 shown in FIG. 1 has a function to quadrature-demodulate a reception signal. Further, the receiver 1 also has a function as a compensation apparatus that compensates quadrature demodulation distortion that occurs at the time of quadrature demodulation.

The receiver 1 includes: an amplifier (low-noise amplifier) 2 that amplifies a reception signal received by an antenna (not shown); a variable attenuator 3 that performs gain control for the reception signal; a frequency converter (down converter) 4 that performs frequency conversion of the reception signal; a quadrature demodulator 5 that performs quadrature demodulation of the reception signal; ADCs 6a and 6b that convert analog I and Q signals output from the quadrature demodulator 5 into digital signals; a quadrature demodulation compensation section 7 that performs compensation for the quadrature-demodulated signal; and a gain compensation section 8 that compensates the gain of the quadrature-demodulated signal.

The quadrature demodulator 5 includes analog components, such as an oscillator 5a, a π/2 phase shifter 5b, and multipliers 5c and 5d, for generating a signal of a reception carrier frequency (a signal of a frequency that matches the reception carrier frequency). The quadrature demodulator 5 is an analog quadrature demodulator (AQD) that performs quadrature demodulation by analog signal processing. Because of variations in the analog components constituting the quadrature demodulator 5, a quadrature-demodulated signal (I/Q signal) obtained by quadrature-demodulating the reception signal is subjected to distortion.

Causes of such distortion are as follows:
1) leakage of a carrier frequency injected from the oscillator 5a (feed through);
2) quadrature deviation caused by variations in manufacture of the π/2 phase shifter 5b;
3) gain imbalance that occurs in two paths from the quadrature demodulator 5 to the ADCs 6a and 6b; and
4) DC offset.

The quadrature demodulation compensation section 7 has a quadrature demodulator correction function, and performs compensation for distortion that occurs in the quadrature-demodulated signal (I/Q signal) due to the quadrature demodulator 5. The quadrature demodulation compensation section 7 includes a local leakage rejection section 7a and an image component rejection section 7b.

The local leakage rejection section (QDC_LLR; Quadrature Demodulator Correction_Local Leakage Rejection) 7a rejects local leakage among the quadrature demodulation distortions. The local leakage is caused by leakage of the carrier frequency and/or DC offset.

The image component rejection section (QDC_IR; Quadrature Demodulator Correction_Image Rejection) 7b rejects an image component among the quadrature demodulation distortions. The image component is caused by quadrature deviation and/or gain imbalance.

The local leakage can be observed regardless of presence/absence of a signal. As for the image component, how the distortion occurs varies depending on a signal.

The local leakage rejection section 7a and the image component rejection section 7b each perform distortion compensation based on compensation parameters (compensation coefficients) $R_{11}$, $R_{21}$, $R_{22}$, dcOffsetRe, and dcOffsetIm for compensating the quadrature demodulation distortion (local leakage or image component). The compensation parameters are calculated by a control section 9.

A compensation process performed by the quadrature demodulation compensation section 7 shown in FIG. 1 can be expressed by the following equation by using the above compensation parameters:

$$\begin{pmatrix} R'_1(t) \\ R'_0(t) \end{pmatrix} = \begin{pmatrix} R_{11} & 0 \\ R_{21} & R_{22} \end{pmatrix} \begin{pmatrix} R_1(t) \\ R_0(t) \end{pmatrix} + \begin{pmatrix} dcOffsetRe \\ dcOffsetIm \end{pmatrix}$$ [Equation 1]

dcOffsetRe and dcOffsetIm are first compensation parameters for rejecting the local leakage. $R_{11}$, $R_{21}$, and $R_{22}$ are second compensation parameters for rejecting the image component.

When calculating the compensation parameters $R_{11}$, $R_{21}$, $R_{22}$, dcOffsetRe, and dcOffsetIm, the control section 9 uses not the normal reception signal received by the antenna but a special signal (reference signal) having a predetermined bandwidth. The reference signal used for calculating the compensation parameters is generated by a signal generator 10.

That is, the signal generator 10 that generates the reference signal, the control section 9 that calculates the compensation parameters $R_{11}$, $R_{21}$, and $R_{22}$ for rejecting the image component based on the quadrature-demodulated signal obtained by quadrature-demodulating the reference signal, and the quadrature demodulation compensation section 7 that rejects the image component among the quadrature demodulation distortions based on the compensation parameters $R_{11}$, $R_{21}$, and $R_{22}$, constitute a compensation apparatus that performs a compensation process of rejecting the image component caused by the quadrature demodulator 5. Although the quadrature demodulation compensation section 7 includes the local leakage rejection section 7a and the image component rejection section 7b, the quadrature demodulation compensation section 7 may include at least the image component rejection section 7b in order that the compensation apparatus rejects the image component caused by the quadrature demodulator 5.

[2. Signal Generator]

Figure 2:
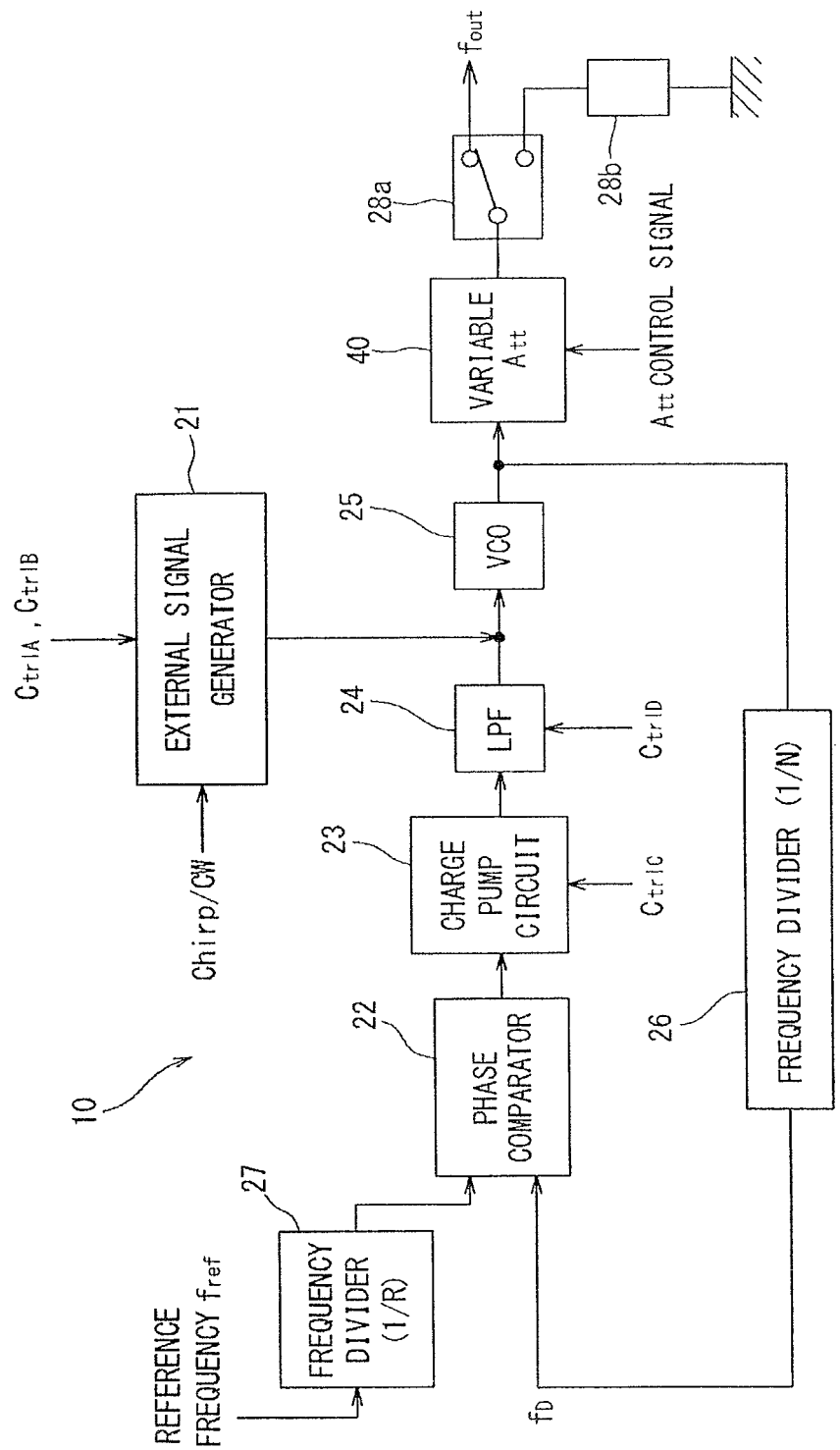
FIG. 2 is a circuit diagram showing a signal generator.

FIG. 2 shows a circuit configuration of the signal generator 10. The signal generator is obtained by adding an external signal generator (external signal generation section) 21 to a phase lock loop (PLL) oscillation circuit.

The PLL oscillation circuit shown in FIG. 2 includes a phase comparator 22, a charge pump circuit 23, a low-pass filter (loop filter) 24, a voltage-controlled oscillator (VCO) 25, and frequency dividers 26 and 27.

The phase comparator 22 compares an output signal of the frequency divider 27 that performs R frequency division on a reference frequency $f_{ref}$, with an output signal of the frequency divider 26 that performs N frequency division on an output signal (frequency $f_{out}$) of the voltage-controlled oscillator 25, and outputs a voltage according to a phase difference between the output signals. The output voltage from the phase comparator 22 passes through the charge pump circuit 23 and the low-pass filter 24 to become a control signal (control voltage) for the voltage-controlled oscillator 25.

The output signal from the voltage-controlled oscillator 25 is fed back to the phase comparator 22 via the frequency divider 26, and thus a phase lock loop is formed. In a general PLL oscillation circuit, the phase lock loop causes the voltage-controlled oscillator 25 to output a signal of a constant frequency.

Figure 3:
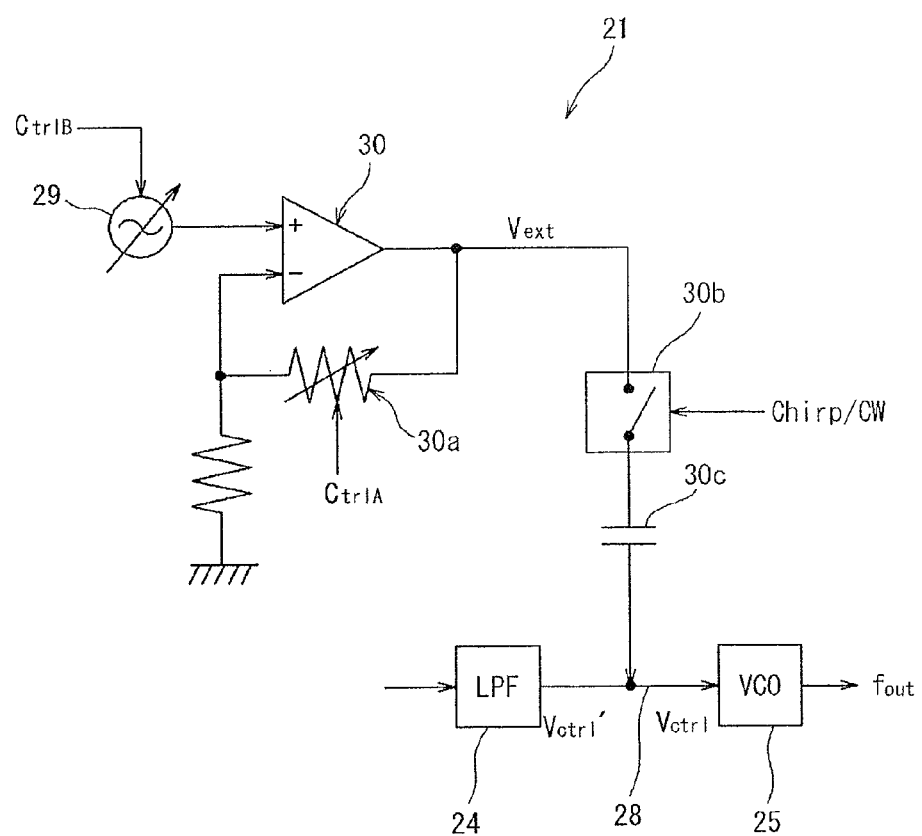
FIG. 3 is a circuit diagram showing an external signal generator and its vicinity.

In contrast, the signal generator 10 shown in FIG. 2 is provided with the external signal generator 21. As shown in FIG. 3, the external signal generator 21 includes an oscillator (variable frequency oscillator) 29 that generates a time-varying signal such as a sine wave. A signal (external signal) $V_{ext}$ generated by the oscillator 29 is superimposed on the control signal for the voltage-controlled oscillator 25.

That is, a control signal (control voltage) $V_{ctrl}$ is generated, in which the external signal $V_{ext}$ is superimposed on an original control signal (original control voltage) $V_{ctrl}'$ generated when the output voltage of the phase comparator 22 has passed through the charge pump circuit 23 and the low-pass filter 24.

In the external signal output generator 21 shown in FIG. 3, the output signal from the oscillator 29 is applied to an input line 28 of the voltage-controlled oscillator 25 via a non-inverting amplifier 30, a switch section (switch) 30b, and a capacitor 30c.

The non-inverting amplifier 30 has a function of adjusting the amplitude of the external signal generated by the oscillator 29. If the amplitude of the external signal $V_{ext}$ need not be adjusted, the non-inverting amplifier 30 may be configured as a voltage follower circuit.

The switch section 30b has a function of switching ON/OFF of superposition of the external signal $V_{ext}$ on the control signal. When the switch section 30b is turned ON, the external signal generator 21 is set in a first mode where the control voltage $V_{ctrl}$ in which the external signal $V_{ext}$ is superimposed on the output voltage of the phase comparator 22 is given to the voltage-controlled oscillator 25. When the switch section 30b is turned OFF, the external signal generator 21 is set in a second mode where the control voltage $V_{ctrl}'$ in which the external signal $V_{ext}$ is not superimposed on the output voltage of the phase comparator 22 is given to the voltage-controlled oscillator 25.

The ON/OFF switching of the switch section 30b is performed by a control signal (Chirp/CW signal) supplied from the control section 9.

The capacitor 30c serves as an AC coupling, and has a function of swinging the external signal $V_{ext}$ with the original control signal $V_{ctrl}'$ being a bias voltage.

Regarding the input-output characteristics of the voltage-controlled oscillator (VCO) 25, the output frequency (oscillation frequency) $f_{out}$ monotonically increases with respect to the control signal (control voltage) $V_{ctrl}$. That is, a signal of an output frequency (oscillation frequency) $f_{out}$ according to the magnitude of the control signal $V_{ctrl}$ is output from the voltage-controlled oscillator (VCO) 25.

A variable attenuator 40 is provided on the output side of the VCO 25. The variable attenuator 40 adjusts the output of the VCO 25 for the purpose of for example, preventing the signal supplied from the signal generator 10 from being saturated when the gain of the receiver is increased. The variable attenuator 40 can be controlled by the control section 9.

Figure 4A:
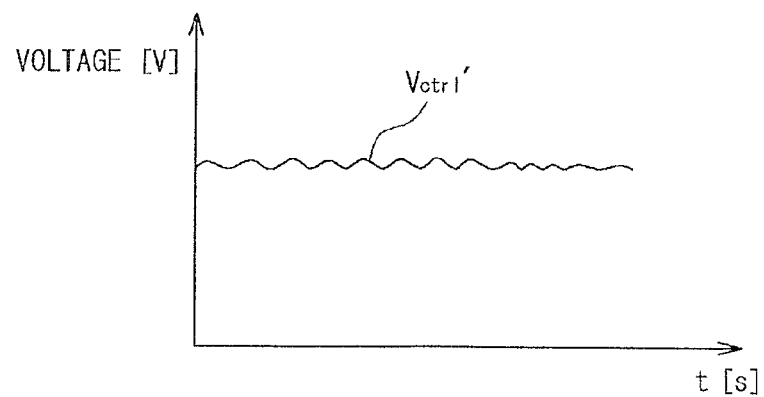
FIG. 4A shows a control signal to a VCO.
Figure 4B:
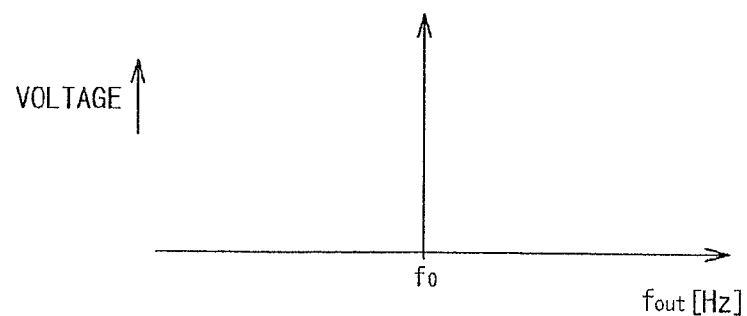
FIG. 4B shows an oscillation frequency of the VCO.

As shown in FIG. 4A, when only the control signal (control voltage) Vctrl' according to the output voltage of the phase comparator 22, on which the external signal Vext is not superimposed, is given to the voltage-controlled oscillator 25, the signal generator 10 functions as a general phase lock loop circuit, and as shown in FIG. 4B, a signal of a single frequency $f_0$ (non-modulated constant wave) is output from the voltage-controlled oscillator 25.

Figure 5A:
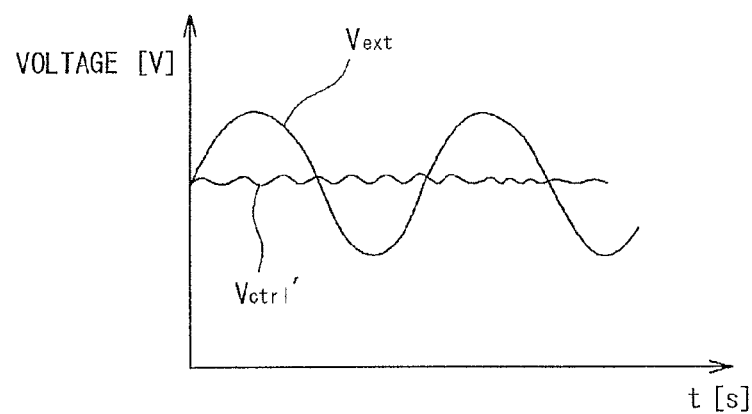
FIG. 5A shows a control signal to a VCO.
Figure 5B:
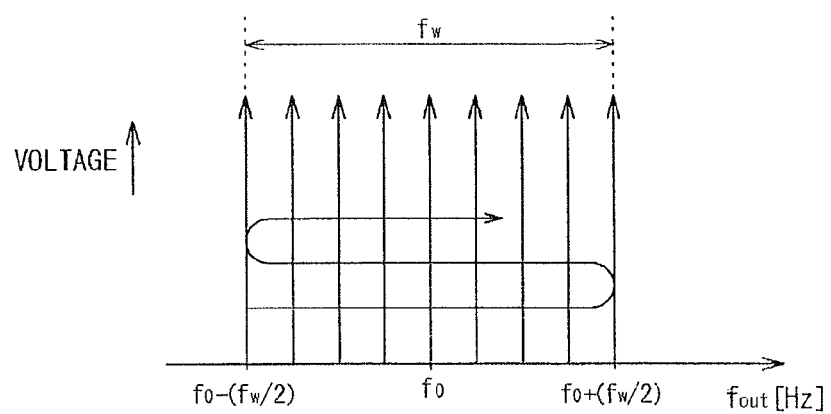
FIG. 5B shows an oscillation frequency of the VCO.

In contrast, when the control signal (control voltage) $V_{ctrl}$ in which the external signal (sine wave) $V_{ext}$ generated by the external signal generator 21 is superimposed on the control signal (control voltage) $V_{ctrl}'$ according to the output voltage of the phase comparator 22 as shown in FIG. 5A is given to the voltage-controlled oscillator 25, the frequency $f_{out}$ of the output signal from the voltage-controlled oscillator 25 temporally varies around the frequency $f_0$ in accordance with the temporal variation of the amplitude value of the external signal $V_{ext}$, as shown in FIG. 5B.

That is, when the amplitude value of the external signal $V_{ext}$ is zero, the output frequency of the voltage-controlled oscillator 25 is the frequency $f_0$ that is locked by the control signal (control voltage) $V_{ctrl}'$. However, when the amplitude value of the external signal $V_{ext}$ becomes larger than zero due to the temporal variation of the external signal $V_{ext}$, the output frequency of the voltage-controlled oscillator 25 becomes larger than $f_0$. Conversely, when the amplitude value of the external signal $V_{ext}$ becomes smaller than zero due to the temporal variation of the external signal $V_{ext}$, the output frequency of the voltage-controlled oscillator 25 becomes smaller than $f_0$.

The variation of the output frequency (oscillation frequency) of the voltage-controlled oscillator 25 in accordance with the temporal variation of the external signal $V_{ext}$ occurs around $f_0$, between $f_0-(f_w/2)$ and $f_0+(f_w/2)$. That is, the frequency range in which the output frequency of the voltage-controlled oscillator 25 temporally varies is $f_w$.

The signal generator 10 includes the external signal generator 21, and therefore, can generate a signal whose frequency temporally varies within the predetermined frequency range $f_w$, like a chirp signal.

The signal whose frequency temporally varies within the predetermined frequency range $f_w$, like a chirp signal, can be regarded as a signal whose frequency bandwidth is $f_w$ when time is ignored. Accordingly, the signal generator 10 can be regarded as a device that generates a signal (reference signal) of the predetermined bandwidth $f_w$.

Conventionally, in order to generate a chirp signal, a signal generated in digital form needs to be converted to an analog signal, and the analog signal needs to be modulated, which might cause high cost and large size of the device.

However, in the signal generator 10 shown in FIG. 2, a chirp signal can be easily generated by only adding the external signal generator 21 to a general PLL circuit.

The value of the bandwidth (frequency range) $f_w$ of the signal generated by the signal generator 10 is determined mainly by the amplitude of the external signal $V_{ext}$. The non-inverting amplifier 30 can be used as a first adjustment section that adjusts the value of the bandwidth (frequency range) $f_w$ by adjusting the amplitude of the external signal $V_{ext}$. The amplification factor of the non-inverting amplifier 30 can be changed by adjusting the value of a variable resistor 30a of the non-inverting amplifier, and as the result, the amplitude of the external signal $V_{ext}$ can be adjusted. A signal $Ctrl_A$ for changing the amplification factor of the non-inverting amplifier 30 is supplied from the control section 9.

The value of the bandwidth (frequency range) $f_w$ of the signal generated by the signal generator 10 is also influenced by other factors than the amplitude of the external signal $V_{ext}$. The other factors include, for example, the ratio between the phase comparison frequency $f_{ref}$ in the phase comparator 22 and the frequency of the external signal $V_{ext}$. When the phase comparison frequency $f_{ref}$ in the phase comparator 22 is high, the phase comparator 22 frequently performs phase comparison, and thereby the degree at which the frequency varied due to the external signal $V_{ext}$ attempts to return to $f_0$ is increased. Accordingly, the higher the phase comparison frequency $f_{ref}$ in the phase comparator is, the smaller the bandwidth (frequency range) $f_w$ of the signal generated by the signal generator 10 can be.

The variable frequency oscillator 29 can be used as a second adjustment section that adjusts the ratio between the phase comparison frequency $f_{ref}$ in the phase comparator 22 and the frequency of the external signal $V_{ext}$. By adjusting the frequency of the external signal $V_{ext}$, the ratio between the phase comparison frequency $f_{ref}$ and the frequency of the external signal $V_{ext}$ is adjusted, and as the result, the amplitude of the external signal $V_{ext}$ can be adjusted. A signal $Ctrl_B$ for changing the oscillation frequency of the variable frequency oscillator 29 is supplied from the control section 9.

In order to cause the circuit shown in FIG. 2 to function as a phase lock loop, the frequency of the external signal $V_{ext}$ should be small. If the frequency of the external signal $V_{ext}$ is excessively large, the frequency that varies with the external signal $V_{ext}$ cannot be appropriately controlled. In this regard, for example, the frequency of the external signal $V_{ext}$ is preferably smaller than the phase comparison frequency $f_{ref}$ in the phase comparator 22, and more preferably, is equal to or smaller than $\frac{1}{10}$ of the phase comparison frequency $f_{ref}$ in the phase comparator 22.

The other factors that influence the value of the bandwidth (frequency range) $f_w$ of the signal generated by the signal generator 10 may include a charge pump current of the charge pump circuit 23. When the charge pump current increases, the responsiveness of the control voltage $V_{ctrl}'$ to the change of the output voltage of the phase comparator 22 is enhanced. Therefore, the response speed at which the frequency varied due to the external signal $V_{ext}$ attempts to return to $f_0$ is increased. Accordingly, the larger the charge pump current is, the smaller the bandwidth (frequency range) $f_w$ of the signal generated by the signal generator 10 can be.

In order to adjust the charge pump current, a resistor that influences the magnitude of the charge pump current in the charge pump circuit 23 should be made variable. The variable resistor serves as a third adjustment section that adjusts the charge pump current. A signal $Ctrl_C$ for changing the charge pump current is supplied from the control section 9.

The other factors that influence the value of the bandwidth (frequency range) $f_w$ of the signal generated by the signal generator 10 may include the time constant of the LPF 24. Even when the charge pump current is constant, if the responsiveness of the LPF 24 itself is enhanced, the responsiveness of the output voltage (control voltage $V_{ctrl}'$) of the LPF 24 is enhanced. Therefore, the response speed at which the frequency varied due to the external signal $V_{ext}$ attempts to return to $f_0$ is increased. Accordingly, the smaller the time constant is set in order to enhance the responsiveness of the LPF 24, the smaller the bandwidth (frequency range) $f_w$ of the signal generated by the signal generator 10 can be.

In order to adjust the time constant of the LPF 24, an element that influences the time constant in the LPF 24 should be made variable. This variable element serves as a fourth adjustment section that adjusts the time constant of the LPF 24.

A signal generated from the signal generator 10 configured as above is given to the amplifier 2 via a switch section 11, and quadrature-demodulated by the quadrature demodulator 5. The switch section 11 can select, as a signal to be given to the amplifier 2 (quadrature demodulator 5), either the reception signal received by the antenna (not shown) or the signal generated by the signal generator 10. A switching control signal is supplied from the control section 9 to the switch section 11.

[3. Process Performed by Control Section]

Figure 6:
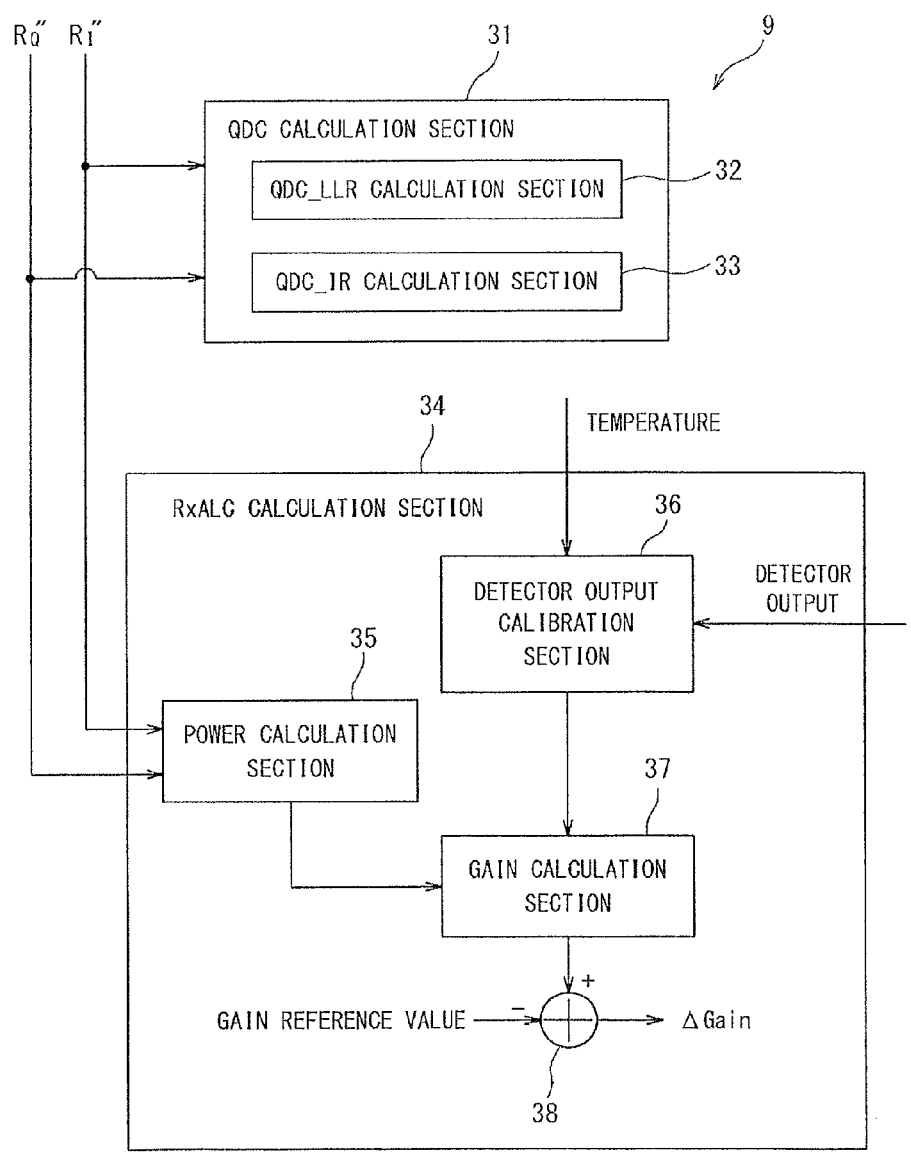
FIG. 6 is a block diagram showing a control section.

As shown in FIG. 6, the control section 9 includes a QDC calculation section (quadrature demodulation compensation calculation section) 31 that calculates compensation parameters used for quadrature demodulation compensation, and an RxALC calculation section (gain compensation calculation section) 34 that calculates compensation values to be referred to by the variable attenuator 3 and/or the gain compensation section 8 for gain compensation.

[3.1 Quadrature Demodulation Compensation]

The QDC calculation section 31 acquires (from the output side of the gain compensation section 8) a quadrature-demodulated signal (I/Q signal) output from the quadrature demodulator 5. Based on the acquired quadrature-demodulated signal, the QDC calculation section 31 calculates a compensation parameter for compensating quadrature demodulation distortion. The calculated compensation parameter is applied to the quadrature demodulation compensation section 7. Using the compensation parameter, the quadrature demodulation compensation section 7 rejects the quadrature demodulation distortion of the quadrature-demodulated signal (I/Q signal).

The QDC calculation section 31 includes a QDC_LLR calculation section (local leakage calculation section) 32 that calculates first compensation parameters dcOffsetRe and dcOffsetIm for rejecting the local leakage, and a QDC_IR calculation section (image component calculation section) 33 as a calculation section for calculating second compensation parameters $R_{11}$, $R_{21}$, and $R_{22}$ for rejecting the image component.

The first compensation parameters dcOffsetRe and dcOffsetIm calculated by the QDC_LLR calculation section 32 are applied to the local leakage rejection section 7a. The second compensation parameters $R_{11}$, $R_{21}$, and $R_{22}$ calculated by the QDC_IR calculation section 33 are applied to the image component rejection section 7b.

If the control section 9 includes at least the QDC_IR calculation section 33 that calculates the second compensation parameters $R_{11}$, $R_{21}$, and $R_{22}$ for rejecting the image component, the control section 9 can realize a function as a calculation section of the compensation apparatus that performs the compensation process of rejecting the image component caused by the quadrature demodulator 5.

Figure 7:
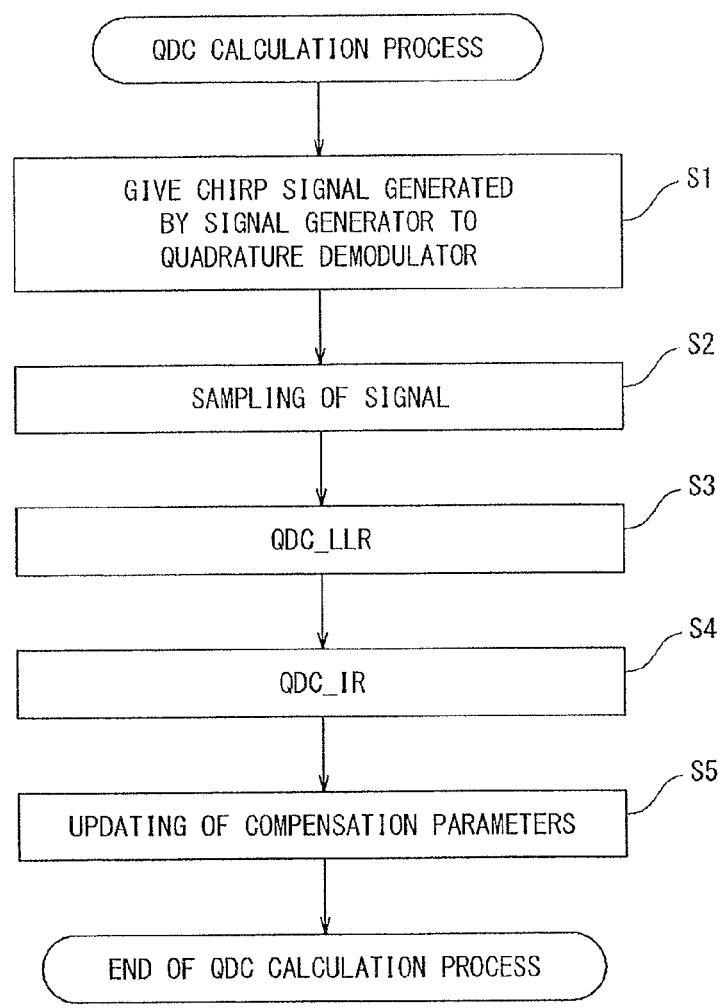
FIG. 7 is a flowchart of a QDC calculation process.

FIG. 7 shows a processing flowchart for calculating (updating) compensation parameters. First, the control section 9 gives a chirp signal generated by the signal generator 10 to the input side of the quadrature demodulator 5 (step S1).

If the receiver 1 includes a plurality of systems (the circuit shown in FIG. 1) each for processing the reception signal, selection of a system to be a target of calculation of compensation parameters should be performed in advance of step S1.

In step S1, the control section 9 outputs, to the switch section 11, a switching control signal that controls the switch section 11 so that the signal generated in the signal generator 10 is given to the amplifier 2 (quadrature demodulator 5) side. Further, the control section 9 outputs, to the external signal generator 21 of the signal generator 10, a mode switching control signal (Chirp/CW signal) so that the signal generator 10 is set in the first mode in which the signal generator 10 outputs not a signal of a single frequency (CW; Constant Wave) but a chirp signal having a predetermined bandwidth $f_w$.

Figure 8:
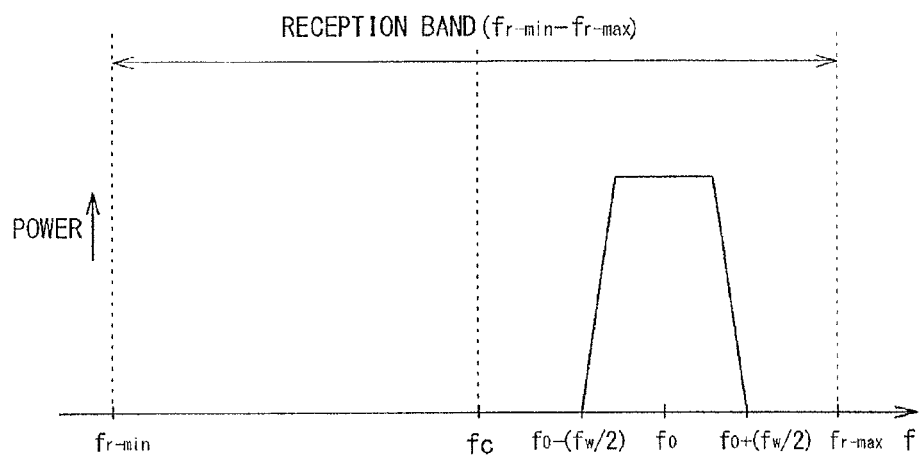
FIG. 8 is a diagram showing a reference signal.

When the mode switching control signal (Chirp/CW signal) that causes the signal generator 10 to generate the chirp signal is given to the switch section 30b of the external signal generator 21, a control voltage $V_{ctrl}$ on which an external signal $V_{ext}$ is superimposed is given to the voltage-controlled oscillator 25. Then, the voltage-controlled oscillator 25 outputs a signal (reference signal) having a predetermined bandwidth as shown in FIG. 8.

The bandwidth of the chirp signal can be appropriately determined according to a system bandwidth used at the time of operation. For example, multiple patterns of amplitudes of external signals $V_{ext}$ are preset according to system bandwidths, and the amplitude of an external signal $V_{ext}$ is selected according to a selected system bandwidth. Further, the chirp signal bandwidth determined based on the amplitude of the external signal $V_{ext}$ can be fine adjusted by adjusting the ratio between the phase comparison frequency $f_{ref}$ and the frequency of the external signal $V_{ext}$, or adjusting the charge pump current, or adjusting the time constant of the LPF 24 (the fine adjustment can be achieved by performing at least one of the above adjustments).

The reference signal is generated as a signal having a predetermined bandwidth $((f_0-(f_w/2))-(f_0+(f_w/2)))$ in a reception band $(f_{r-min}-f_{r-max})$.

The reference signal has a frequency band biased to the higher-frequency side with respect to the reception carrier frequency fc that is the center frequency in the reception band. In FIG. 8, the frequency band of the reference signal exists only on the higher-frequency side with respect to the carrier frequency fc, and does not exist on the lower-frequency side with respect to the carrier frequency fc. In addition, the frequency band of the reference signal is located apart from the carrier frequency fc.

The carrier frequency fc (the center frequency of the reception signal) might be changed. The center frequency $f_0$ and/or the bandwidth $f_w$ of the chirp signal may be adjusted so that the relationship as shown in FIG. 8 can be maintained even when the carrier frequency fc is changed.

When the reference signal shown in FIG. 8 passes through the quadrature demodulator 5, quadrature demodulation distortion is added to the reference signal. The quadrature-demodulated signal (I/Q signal) having the quadrature demodulation distortion is sampled by the QDC calculation section 31 (step S2).

The QDC_LLR calculation section 32 calculates a local leakage amount based on the sampled quadrature-demodulated signal (step S3). Since the reference signal has no DC component because of an AC coupling (not shown), the center of an IQ constellation is supposed to be an original point on an IQ plane if no local leakage occurs. However, when each of the I and Q signals includes an influence of local leakage, the zero point of the constellation of the quadrature-demodulated signal deviates from the original point on the IQ plane.

Figure 9:
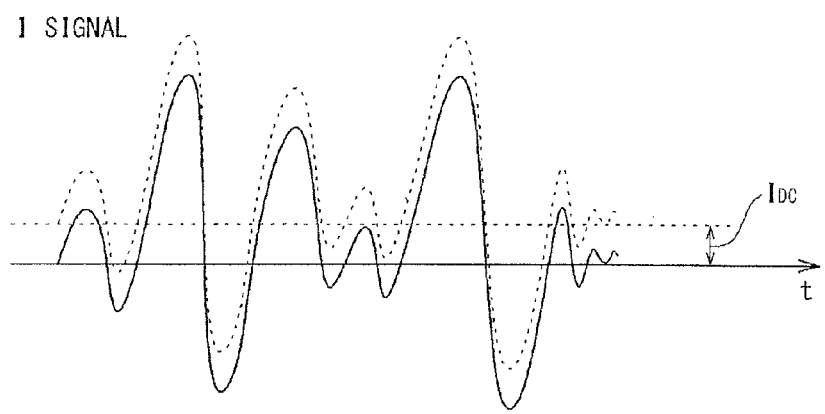
FIG. 9 is a diagram showing an I signal having a DC offset.
Figure 10:
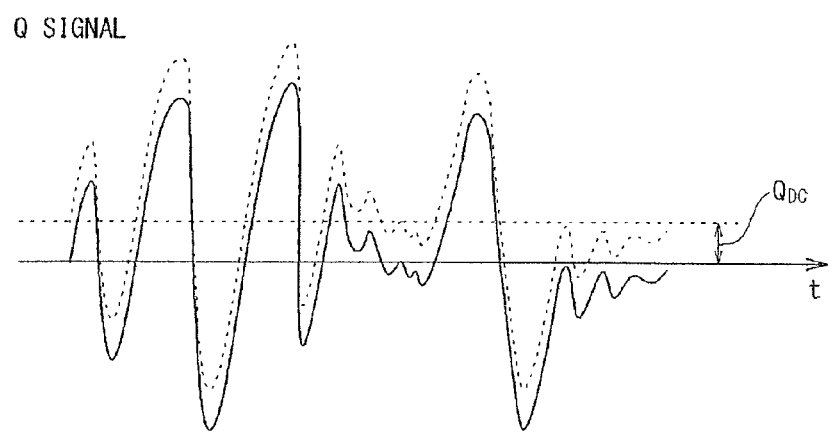
FIG. 10 is a diagram showing a Q signal having a DC offset.

That is, in the case where the I and Q signals include DC components $I_{DC}$ and $Q_{DC}$ due to local leakage as shown in FIG. 9 and FIG. 10, respectively, when a time average of each of the I and Q signals is calculated, the DC components $I_{DC}$ and $Q_{DC}$ each corresponding to the local leakage are obtained. Thus obtained DC components $I_{DC}$ and $Q_{DC}$ are used for updating (step S5) of the first compensation parameters dcOffsetRe and dcOffsetIm for canceling the local leakage, respectively.

The QDC_IR calculation section 33 calculates an image component based on the sampled quadrature-demodulated signal (step S4).

Now, it is assumed that the I signal in which no image component is caused by the quadrature demodulator 5 is Refsig_re[n], the Q signal in which no image component is caused by the quadrature demodulator 5 is Refsig_Im[n], the I signal in which an image component caused by the quadrature demodulator 5 is superimposed on Refsig_re[n] is Rxsig_re[n], and the Q signal in which an image component due to the quadrature demodulator 5 is superimposed on the Refsig_Im[n] is Rxsig_Im[n]. Then, the image components caused by the quadrature demodulator are expressed as follows:

$$\begin{pmatrix} \text{Rxsig\_re}[n] \\ \text{Rxsig\_im}[n] \end{pmatrix} = \begin{pmatrix} Rtmp_{11} & 0 \\ Rtmp_{21} & Rtmp_{22} \end{pmatrix} \begin{pmatrix} \text{Refsig\_re}[n] \\ \text{Refsig\_im}[n] \end{pmatrix} \quad \text{[Equation 2]}$$

In the above equation, $R_{tmp11}$, $R_{tmp21}$, and $R_{tmp22}$ correspond to the image components.

Here, *[n] indicates a digital complex baseband IQ signal that is sampled at time n×T where the sampling interval is T (sec). In addition, *(t) indicates an analog signal at time t.

The QDC_IR calculation section 33 calculates the above $R_{tmp11}$, $R_{tmp21}$, and $R_{tmp22}$ as the image components.

The QDC_IR calculation section 33 estimates $R_{tmp21}$, $R_{tmp21}$, and $R_{tmp22}$ in the above equation, by using an arbitrary numerical calculation method such as a least squares method, so as to satisfy the following relation:

$$R_{tmp11} - R_{tmp22} = 1 \quad \text{[Equation 3]}$$

In order to calculate the image components by using the above equation, the QDC_IR calculation section 33 performing digital processing needs, in additions to the output signals Rxsig_re[n] and Rxsig_Im[n] of the quadrature demodulator 5, the digital I and Q signals Refsig_re[n] and Refsig_Im[n] in which no image component is caused by the quadrature demodulator 5.

As is apparent from the circuit configuration shown in FIG. 1, it is easy for the QDC_IR calculation section 33 performing digital processing to acquire the output signals Rxsig_re[n] and Rxsig_Im[n] of the quadrature demodulator 5. On the other hand, it is not easy for the QDC_IR calculation section 33 to acquire the digital I and Q signals Refsig_re[n] and Refsig_Im[n] in which no image component is caused by the quadrature demodulator 5.

In the receiver 1 according to the present embodiment, however, since replicas of Refsig_re[n] and Refsig_Im[n] can be generated from the output signals Rxsig_re[n] and Rxsig_Im[n] of the quadrature demodulator 5, respectively, calculation of the image components is facilitated.

Here, the outputs of the quadrature demodulation compensation section 7 (and the gain compensation section 8) are considered as the outputs of the quadrature demodulator 5. That is, the following relations are satisfied:

$R_I''$: Rxsig_re[n]

$R_Q''$: Rxsig_Im[n]

In the receiver 1 according to the present embodiment, when the compensation parameters are calculated, the reference signal (FIG. 8) output from the signal generator 10 is input to the quadrature demodulator 5.

Figure 11A:
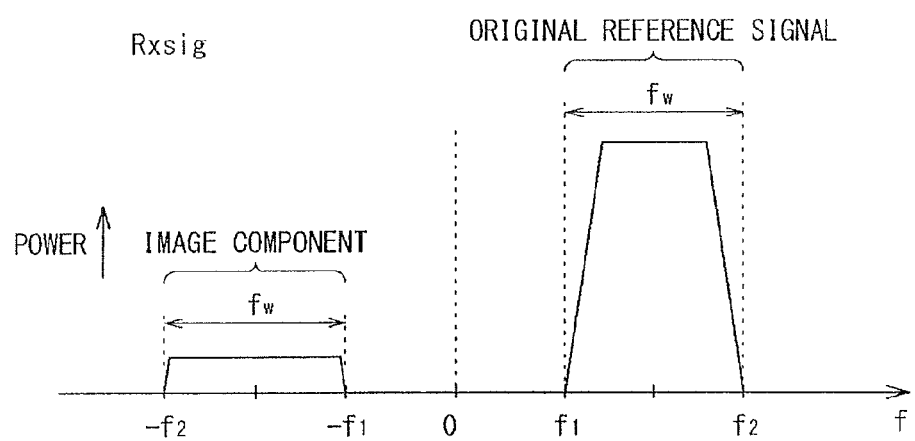
FIG. 11A is a diagram showing a quadrature-demodulated signal.

A quadrature-demodulated signal Rxsig[n] (=Rxsig_re[n]+i×Rxsig_Im[n]) is obtained when the reference signal passes through the quadrature demodulator 5. In the signal Rxsig[n], as shown in FIG. 11A, a portion corresponding to the original reference signal and a portion corresponding to the image component appear in different positions. The reason is as follows. The frequency band of the reference signal exists only at one side (the higher-frequency side) with respect to the carrier frequency fc, and the image component appears symmetrically to the original reference signal with respect to the carrier frequency fc. That is, the image component appears in a frequency band symmetrical to the frequency band of the reference signal in the frequency direction with respect to the carrier frequency fc.

Since FIG. 11 shows the signals treated in the quadrature demodulation compensation section 7 performing digital processing, the frequency corresponding to the carrier frequency fc is 0.

Since the frequency band of the reference signal exists only on one side (higher-frequency side) with respect to the carrier frequency fc, the QDC_IR calculation section 33 may regard the component existing on the opposite side (lower-frequency side) with respect to the carrier frequency fc, not as a reference signal but as an image component.

Figure 11B:
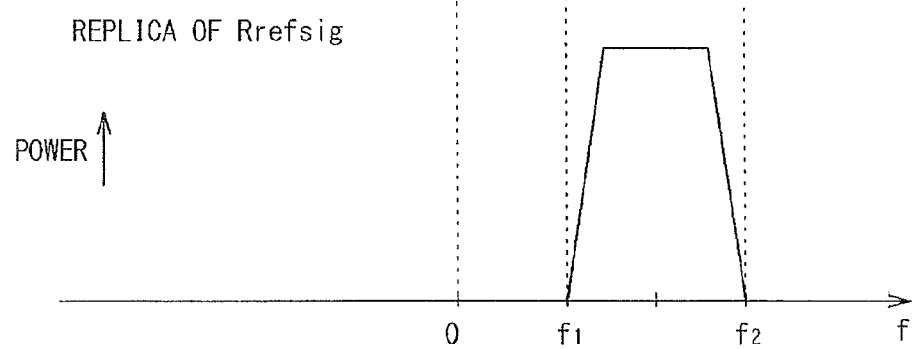
FIG. 11B shows a reference signal replica generated from the quadrature-demodulated signal.

So, when acquiring the quadrature-demodulated signal Rxsig[n] (=Rxsig_re[n]+i×Rxsig_Im[n]) as shown in FIG. 11A, the QDC_IR calculation section 33 removes, from the quadrature-demodulated signal, the signal on the lower-frequency side relative to the carrier frequency fc (on the lower-frequency side relative to the frequency=0). As shown in FIG. 11B, in the quadrature-demodulated signal after the removal, no image component exists, and only the reference signal remains.

In the present embodiment, the portion corresponding to the original reference signal and the portion corresponding to the image component appear in different frequencies, and therefore, can be easily separated from each other.

An ideal digital reference signal Refsig[n]=Refsig_re[n]+i×Refsig_Im[n] is a signal obtained by quadrature-demodulating the analog reference signal output from the signal generator 10, using the quadrature demodulator 5 applying no quadrature demodulation distortion, and converting the analog signal to a digital signal by the ADCs 6a and 6b. The signal shown in FIG. 11B has no image component.

Accordingly, the signal shown in FIG. 11B is a replica (reference signal replica) of the ideal digital reference signal Refsig[n].

The QDC_IR calculation section 33 calculates the image components $R_{tmp11}$, $R_{tmp21}$, and $R_{tmp22}$ by using the signal (signal for calculation) shown in FIG. 11A and the reference signal replica shown in FIG. 11B.

That is, the QDC_IR calculation section 33 calculates $R_{tmp21}$, $R_{tmp21}$, and $R_{tmp22}$ by using the acquired quadrature-demodulated signals $R_I''$ and $R_Q''$ as they are as the image component calculation signals Rxsig_re[n] and Rxsig_Im[n], respectively, and using the replica (Replica_Refsig[n]) of the reference signal Refsig[n] as the reference signal Refsig[n] (=Refsig_Re[n]+i×Refsig_Im[n]).

The replica of the reference signal Refsig[n] is expressed by: Replica_Refsig[n]=Replica_Refsig_Re[n]+i×Replica_Refsig_Im[n].

In addition, Refsig[n]=α×Replica_Refsig[n] is satisfied (α is a positive real value that is not 0).

Subsequently, the QDC calculation section 31 calculates (updates) the first compensation parameters dcOffsetRe and dcOffsetIm for canceling the DC components $I_{DC}$ and QDC calculated in step S3 (step S5).

Further, the QDC calculation section 31 calculates (updates) the second compensation parameters $R_{11}$, $R_{21}$, and $R_{22}$ for canceling the image components $R_{tmp21}$, $R_{tmp21}$, and $R_{tmp22}$ estimated in step S4 (step S5). The QDC calculation section 31 gives the calculated first and second compensation parameters to the quadrature demodulation compensation section 7.

In the present embodiment, as shown in FIG. 8, the reference signal exists only in a frequency band on the higher-frequency side with respect to the carrier frequency fc. However, the reference signal may exist only in a frequency band on the lower-frequency side with respect to the carrier frequency fc.

Further, the reference signal may have a frequency band biased to either the higher-frequency side or the lower-frequency side with respect to the carrier frequency fc. That is, the reference signal may extend across the carrier frequency fc, and be biased to either the higher-frequency side or the lower-frequency side with respect to the carrier frequency fc.

Figure 12A:
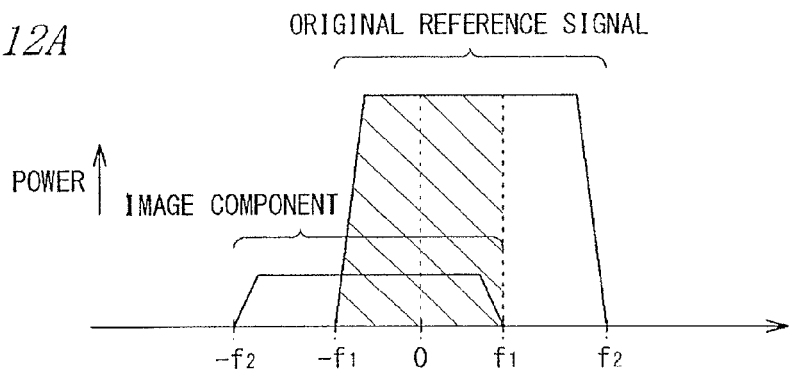
FIG. 12A is a diagram showing a quadrature-demodulated signal.

When the reference signal is biased to either the higher-frequency side or the lower-frequency side, a portion on which no image component is superimposed is ensured in at least a part of the portion corresponding to the original reference signal as shown in FIG. 12A. By using the portion on which no image component is superimposed, as a reference signal replica, it is possible to estimate the image component.

For example, it is assumed that the frequency band of the reference signal ranges from $-f_1$ to $f_2$ ($f_1 < f_2$) as shown in FIG. 12A. In this case, an image component appears in the range from $-f_2$ to $f_1$, and overlaps with the reference signal.

Since there is a large level difference between the reference signal and the image component, the QDC_IR calculation section 33 can detect a portion having a level difference equal to or higher than a threshold (e.g., 20 dB) with respect to the reference signal, as a portion where only the image component exists. Thereby, as shown in FIG. 12B, only the image component existing in the range from $-f_2$ to $-f_1$ can be extracted.

The image component existing in the range from $-f_2$ to $-f_1$ is caused by the reference signal in the range from $f_1$ to $f_2$ that is symmetrical to the image component with respect to the carrier frequency fc (in FIG. 12, frequency=0). In the range from $f_1$ to $f_2$, there is no image component overlapping the reference signal.

Figure 12B:
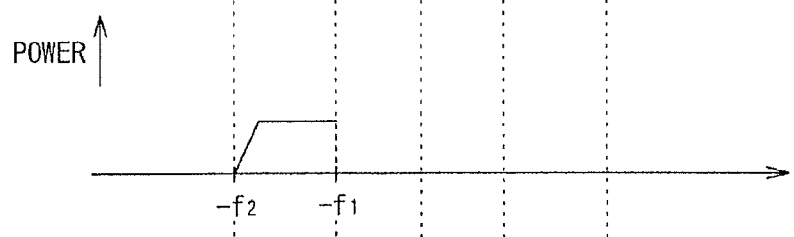
FIG. 12B is a diagram showing a signal in which a portion where only an image component exists is extracted.
Figure 12C:
FIG. 12C is a diagram showing a signal in which a portion where only a reference signal exists is extracted.

Therefore, the QDC_IR calculation section 33 extracts, from the signal shown in FIG. 12A, the signal in the range from $f_1$ to $f_2$, thereby obtaining (a part of) the reference signal on which no image component is superimposed, as shown in FIG. 12C. The signal shown in FIG. 12C (corresponding to a part of the reference signal) may be used as the reference signal replica Replica_Refsig[n].

Figure 12D:
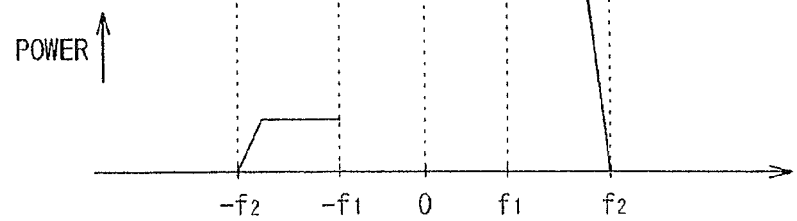
FIG. 12D is a diagram showing a signal obtained by combining the signals shown in FIG. 12B and FIG. 12C.

Further, as the image component calculation signals Rxsig_re[n] and Rxsig_Im[n], a signal shown in FIG. 12D may be used, which is obtained by combining the reference signal replica shown in FIG. 12C and the signal shown in FIG. 12B (the image component caused by the reference signal replica shown in FIG. 12C).

As described above, as the reference signal replica used for calculation of the image component, a portion corresponding to the entirety of the reference signal may be used, or alternatively, when the image component is superimposed on the reference signal, a portion obtained by removing the portion on which the image component is superimposed may be used.

Further, as the signal for calculation, the quadrature-demodulated signal may be used as it is, or alternatively, when the quadrature-demodulated signal includes a portion where the reference signal and the image component overlap each other, the quadrature-demodulated signal from which the overlapping portion is removed may be used.

[3.2 Gain Compensation]

The control section 9 is also able to perform calculation for gain compensation by using a signal (CW) output from the signal generator 10.

As shown in FIG. 6, the RxALC calculation section 34 that calculates compensation values for gain compensation includes a power calculation section 35, a detector output calibration section 36, and a gain calculation section 37.

The RxALC calculation section (measurement section) 34 measures and monitors the ratio between the power of the signal (CW) output from the signal generator 10 and the powers of the quadrature-demodulated reception signals $R_I''$ and $R_Q''$, thereby calculating compensation values for gain compensation in the variable attenuator 3 and/or the gain compensation section 8.

As also shown in FIG. 1, an output of a detector 12 that detects a signal (SW) output from the signal generator 10 is given to the RxALC calculation section 34 via the ADC 12a. Further, the quadrature-demodulated signals $R_I''$ and $R_Q''$ are given to the RxALC calculation section 34.

Further, an output of a temperature sensor 13 is given to the RxALC calculation section 34 via the ADC 14.

The power calculation section 35 in the RxALC calculation section 34 calculates the reception powers of the quadrature-demodulated signals $R_I''$ and $R_Q''$.

The detector output calibration section 36 calibrates the output of the detector 12 (the power of the signal (CW)) with temperature (the output of the temperature sensor 13), and calculates the calibrated reception power. The detector output calibration section 36 includes a table for temperature calibration, and calculates the calibrated reception power with reference to the table.

The gain calculation section 37 calculates the ratio between the reception power based on the detector output and the reception powers of the quadrature-demodulated signals $R_I''$ and $R_Q''$. The output of the gain calculation section 37 is given to a calculator 38. The calculator 38 calculates a deviation ΔGain of the output of the gain calculation section 37 from a gain reference value.

Figure 13:
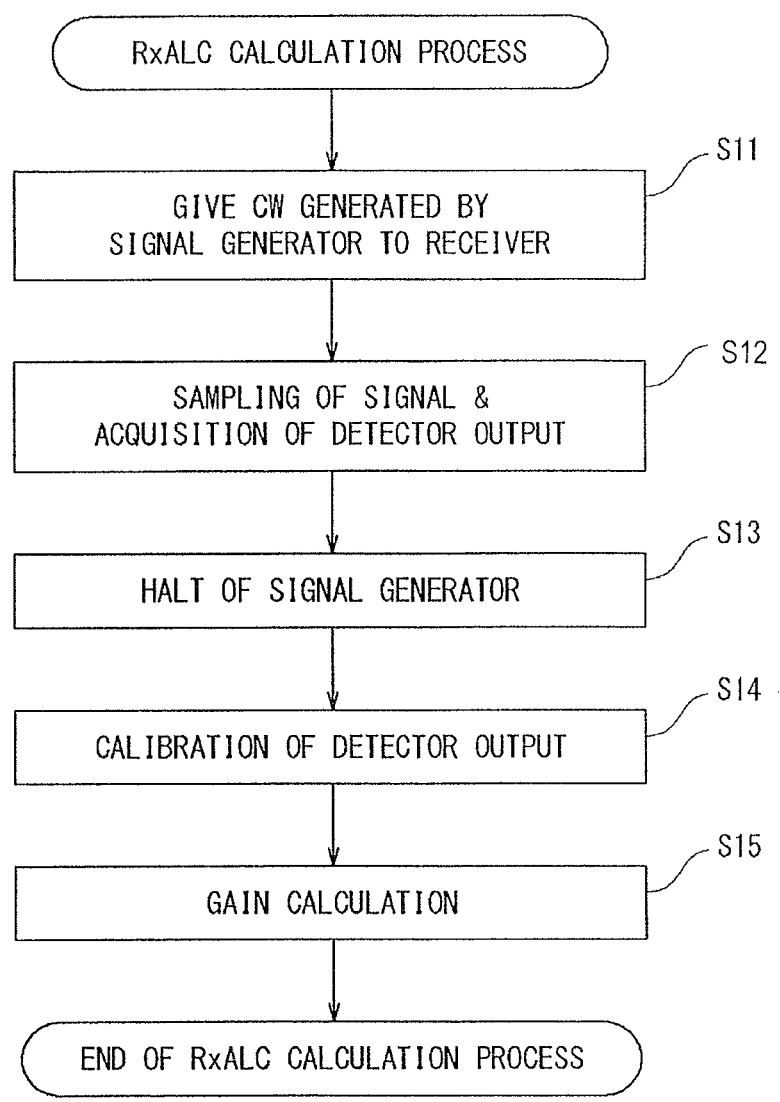
FIG. 13 is a flowchart of an RxALC calculation process.

FIG. 13 shows a processing flowchart for calculating gains ΔGain1 and ΔGain2 to be compensation values for gain compensation in the variable attenuator 3 and/or the gain compensation section 8. First, the control section 9 gives, to the input of the receiver 1, a signal (CW; non-modulated constant wave) generated from the signal generator 10, instead of a usual reception signal (step S11).

If the receiver 1 includes a plurality of systems (the circuit shown in FIG. 1) each for processing the reception signal, selection of a system to be a target of calculation of gain compensation should be performed in advance of step S11.

In step S11, the control section 9 outputs, to the switch section 11, a switching control signal that controls the switch section 11 so that the signal generated in the signal generator 10 is given to the amplifier 2 (quadrature demodulator 5) side. Further, the control section 9 outputs a mode switching control signal (Chirp/CW signal) to the external signal generator 21 of the signal generator 10 so that the signal generator 10 is set in the second mode in which the signal generator 10 outputs a signal of a single frequency (CW; Constant Wave).

When the switching control signal (Chirp/CW signal) for generating a CW signal is given to the switch section 30b in the external signal generator 21, a control voltage $V_{ctrl}'$ on which an external signal $V_{ext}$ is not superimposed is given to the voltage-controlled oscillator 25. Then, the voltage-controlled oscillator 25 outputs a signal of a simple frequency (CW).

The RxALC calculation section 34 performs sampling of the digital quadrature-demodulated signals $R_I''$ and $R_Q''$ which have been obtained by quadrature-demodulating the signal of the single frequency (CW) generated by the signal generator 10, and converting the quadrature-demodulated signals into digital signals (step S12). Further, the RxALC calculation section 34 acquires a digital signal which has been obtained by detecting, by the detector 12, the single-frequency signal (CW) generated by the signal generator 10 to obtain a power value (detector output), and converting, by the ADC 14, the obtained power value (step S12).

When the signal acquisition in step S12 is ended, the control section 9 causes the signal generator 10 to halt the generation of the signal (CW) (step S13). In order to cause the signal generator 10 to halt the generation of the signal (CW), a switch 28a provided on the output side of the VCO 25 is switched to a terminal 28b side.

The detector output calibration section 36 calibrates the detector output (power) with reference to the temperature calibration table (step S14).

The power calculation section 35 calculates the time average value of the power of the single-frequency signal (CW) based on the digital quadrature-demodulated signals $R_I''$ and $R_Q''$ obtained by the sampling, and gives the calculation result to the gain calculation section 37.

The gain calculation section 37 calculates the ratio between the power output from the power calculation section 35 and the power output from the detector output calibration section 36, and outputs the ratio (step S15).

The calculator 38 performs calculation by using the power ratio output from the gain calculation section 37, and the gain reference value. The calculator 38 calculates a deviation ΔGain of the power ratio output from the gain calculation section 37, from the gain reference value. The gain reference value is a value to be a target in adjusting the power ratio output from the gain calculation section 37, and is an ideal power ratio between the detector output and the power of the digital quadrature-demodulated signal.

If the power ratio output from the gain calculation section 37 exceeds the gain reference value, the control section 9 gives, to the variable attenuator 3 and/or the gain compensation section 8, a signal for adjusting the gains of the variable attenuator 3 and/or the gain compensation section 8 so as to eliminate the deviation ΔGain.

The variable attenuator 3 and/or the gain compensation section 8 operate to adjust the gains based on the signal from the control section 9 so as to eliminate the deviation ΔGain.

The gain reference value may be, for example, determined in advance, or received from the outside via an input interface.

[4. Appended Notes]

The embodiments described above are to be considered in all respects as illustrative and not restrictive. The scope of the present invention is indicated by the appended claims rather than by the foregoing meaning, and all changes which come within the meaning and range of equivalency of the claims are therefore intended to be embraced therein.

Further, among the embodiments described above, at least a part of components described as one embodiment may be combined with at least a part of components described as another embodiment.

DESCRIPTION OF THE REFERENCE CHARACTERS 1 communication equipment (receiver)
2 amplifier
3 variable attenuator
4 frequency converter
5 quadrature demodulator
5a oscillator
5b phase shifter
5c, 5d multiplier
6a, 6b ADC
7 quadrature demodulation compensation section
7a local leakage rejection section
7b image component rejection section
8 gain compensation section
9 control section
10 signal generator
11 switch section
12 detector
13 temperature sensor
21 external signal generator
22 phase comparator
23 charge pump circuit
24 low-pass filter
25 voltage-controlled oscillator
26 frequency divider
28 input line
30 non-inverting amplifier
30a variable resistor
30b switch
30c capacitor
31 quadrature demodulation compensation calculation section
32 local leakage calculation section
33 image component calculation section
34 gain compensation calculation section (measurement section)
35 power calculation section
35 reception power calculation section
36 detector output calibration section
37 gain calculation section
38 calculator

The invention claimed is:

1. A signal generator that is a phase lock loop type signal generator in which an oscillation frequency of a voltage-controlled oscillator is determined by a control voltage based on an output signal of a phase comparator,
   the signal generator including an external signal generation section for generating an external signal that varies with time at a predetermined amplitude, wherein
   the control voltage is obtained by superimposing the external signal on the output signal of the phase comparator, the external signal varying with time at a predetermined amplitude, and
   a frequency of the external signal is smaller than a phase comparison frequency in the phase comparator.

2. The signal generator according to claim 1, further comprising:
   an adjustment section for adjusting an amplitude of the external signal.

3. The signal generator according to claim 1, further comprising:
   a charge pump circuit provided between the phase comparator and the voltage-controlled oscillator; and
   an adjustment section for adjusting a charge pump current flowing through the charge pump circuit.

4. The signal generator according to claim 1, further comprising:
   a low-pass filter provided between the phase comparator and the voltage-controlled oscillator; and
   an adjustment section for adjusting a time constant of the low-pass filter.

5. The signal generator according to claim 1, further comprising:
   an adjustment section for adjusting a frequency range of the oscillation frequency of the voltage-controlled oscillator, the oscillation frequency varying with time, wherein
   the adjustment section adjusts the frequency range by that the external signal is superimposed on the output signal of the phase comparator.

6. The signal generator according to claim 1, wherein the external signal is a sine wave.

7. The signal generator according to claim 1, further comprising:
   a switch section for performing switching between a first mode where the control voltage in which the external signal is superimposed on the output signal of the phase comparator is given to the voltage-controlled oscillator, and a second mode where a control voltage in which the external signal is not superimposed on the output signal of the phase comparator is given to the voltage-controlled oscillator.

8. Wireless communication equipment for using a signal generated by the signal generator according to claim 1.

9. A signal generator that is a phase lock loop type signal generator in which an oscillation frequency of a voltage-controlled oscillator is determined by a control voltage based on an output signal of a phase comparator, the signal generator including an external signal generation section for generating an external signal that varies with time at a predetermined amplitude, wherein the control voltage is obtained by superimposing the external signal on the output signal of the phase comparator, the external signal varying with time at a predetermined amplitude;

the signal generator further comprising:

an adjustment section for adjusting a ratio between the phase comparison frequency in the phase comparator and the frequency of the external signal.

* * * * *